United States Patent
Chen et al.

(10) Patent No.: US 11,473,586 B2
(45) Date of Patent: Oct. 18, 2022

(54) THIN COOLING FAN

(71) Applicant: DELTA ELECTRONICS, INC., Taoyuan (TW)

(72) Inventors: Cheng-Wei Chen, Taoyuan (TW); Hsiang-Jung Huang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 180 days.

(21) Appl. No.: 16/598,828

(22) Filed: Oct. 10, 2019

(65) Prior Publication Data

US 2020/0040900 A1 Feb. 6, 2020

Related U.S. Application Data

(63) Continuation of application No. 15/812,602, filed on Nov. 14, 2017, now abandoned, which is a (Continued)

(30) Foreign Application Priority Data

Apr. 18, 2014 (CN) .......................... 201410158276.2

(51) Int. Cl.
*F04D 29/40* (2006.01)
*F04D 25/06* (2006.01)
(Continued)

(52) U.S. Cl.
CPC ......... *F04D 25/0613* (2013.01); *F04D 17/16* (2013.01); *F04D 29/424* (2013.01); *F04D 29/4226* (2013.01); *F04D 29/441* (2013.01); *F04D 29/626* (2013.01); *G06F 1/203* (2013.01); *H02K 5/225* (2013.01); (Continued)

(58) Field of Classification Search
CPC ............. F04D 29/4226; F04D 29/4233; F04D 29/424; F04D 29/4246; F04D 29/4253; F04D 5/007; F04D 29/4293; F04D 25/0613; F04D 29/441; F04D 17/16; F04D 29/626; F04D 29/40; F04D 29/403; F04D 29/4206; H02K 11/0094; H02K 5/225; H02K 2211/03; H02K 5/20; H05K 7/20136; G06F 1/203
See application file for complete search history.

(56) References Cited

U.S. PATENT DOCUMENTS 2,050,523 A * 8/1936 Freed .................... F04D 29/441
                                                         415/98
4,818,907 A    4/1989 Shirotori
(Continued)

*Primary Examiner* — Essama Omgba
*Assistant Examiner* — Dnyanesh G Kasture
(74) *Attorney, Agent, or Firm* — Hauptman Ham, LLP

(57) ABSTRACT

A thin cooling fan includes a fan shell, a motor, a plurality of blades, and a PCB. The fan shell comprises a base plate and a shell cover which cover to each other to form an inner space. The base plate has a first surface facing toward the inner space and a second surface having a receiving space and opposite to the first surface. The motor is combined in the inner space. The blades are disposed in the inner space and rotated by the motor. The PCB is disposed in the receiving space and flush with the second surface. Thus, the whole thickness of the cooling fan is reduced and the flow channel design in the inner space is not affected.

12 Claims, 8 Drawing Sheets

Related U.S. Application Data continuation-in-part of application No. 14/314,388, filed on Jun. 25, 2014, now Pat. No. 9,846,462.

(51) Int. Cl.
| | |
|---|---|
| *F04D 29/42* | (2006.01) |
| *H05K 7/20* | (2006.01) |
| *H02K 11/00* | (2016.01) |
| *H02K 5/22* | (2006.01) |
| *F04D 29/44* | (2006.01) |
| *F04D 17/16* | (2006.01) |
| *F04D 29/62* | (2006.01) |
| *G06F 1/20* | (2006.01) |
| *H02K 5/20* | (2006.01) |

(52) U.S. Cl.
CPC ..... *H02K 11/0094* (2013.01); *H05K 7/20136* (2013.01); *H02K 5/20* (2013.01); *H02K 2211/03* (2013.01)

(56) References Cited

U.S. PATENT DOCUMENTS

| | | | |
|---|---|---|---|
| 2004/0253092 A1 | 12/2004 | Hancock | |
| 2007/0212218 A1* | 9/2007 | Seki | F04D 29/4226 415/204 |
| 2011/0033287 A1 | 2/2011 | Lindner | |
| 2011/0149511 A1 | 6/2011 | Zhang et al. | |
| 2013/0071238 A1* | 3/2013 | Lu | G06F 1/203 415/203 |
| 2013/0164158 A1 | 6/2013 | Matsuba et al. | |
| 2013/0323093 A1 | 12/2013 | Tamaoka et al. | |
| 2014/0119906 A1* | 5/2014 | Lin | F04D 29/424 415/203 |
| 2014/0301828 A1* | 10/2014 | Aiello | F04D 25/062 415/111 |

\* cited by examiner

THIN COOLING FAN

CROSS-REFERENCE TO RELATED APPLICATIONS

This application is a continuation application of U.S. application Ser. No. 15/812,602 filed on Nov. 14, 2017, which is a continuation-in-part application of U.S. application Ser. No. 14/314,388 filed on Jun. 25, 2014, now U.S. Pat. No. 9,846,462 issued Dec. 19, 2017, which claims priority to China patent Application No. 201410158276.2 filed on Apr. 18, 2014. The entire disclosure is incorporated herein by reference.

BACKGROUND OF THE INVENTION

Field of the Invention

The present invention relates to a cooling fan and, in particular, to a structure of a thin cooling fan.

Description of Related Art

Recently the light and handy tablet computer has become very popular and the notebook computer also gradually follows a slim design. However, the inner space of the computer decreases accordingly as the slim design of the computer main unit is used. To this end, how to arrange and design an effective cooling fan in such a limited inner space inside the computer to dissipate the heat generated by the operating electronic devices for a normal operation is a critically important issue.

Moreover, the assembly methods of the PCB (Printed Circuit Board) of the existing cooling fan can be roughly divided into two types, general assembly and plate attachment assembly. For the general assembly, the stator winding of the motor is firstly soldered on the PCB; then the stator winding and the PCB are assembled to the fan shaft. The plate attachment assembly is designed for the thin cooling fan, in which the PCB is firstly attached in the fan and then the stator winding of the motor is fixed to the fan shaft and finally the soldering between the stator winding and the PCB is performed.

In the above two assembly methods of the PCB of the cooling fan, the plate attachment assembly has better utilization of the inner space of the fan, which can reduce the whole thickness of the cooling fan. However, since the electronic devices on the PCB and the PCB itself will affect the flow design inside the fan and especially their heights occupy certain spaces inside the fan, hindering the thinning of the cooling fan.

In view of foregoing, the inventor pays special attention to research with the application of related theory to propose the cooling fan of the present invention, a reasonable design, to overcome the above disadvantages regarding the above related art.

SUMMARY OF THE INVENTION

It is an objective of the present invention to provide a thin cooling fan, in which a receiving space is disposed outside a base plate and a PCB is attached in the receiving space such that the PCB and the base plate overlap partially to achieve the thinning of the cooling fan.

It is another objective of the present invention to provide a thin cooling fan, in which the disposition of a hollow zone of the base plate moves blades closer to the base plate to reduce the whole height of the fan.

It is yet another objective of the present invention to provide a thin cooling fan, in which the PCB is attached outside the base plate, thereby simplifying the assembly to improve the assembly efficiency and yield rate.

To achieve the above objectives, the present invention provides a thin cooling fan which comprises a fan shell, a motor, a plurality of blades, and a PCB. The fan shell comprises a base plate and a shell cover. The base plate and the shell combined with each other to form an inner space. The base plate has a first surface facing toward the inner space and a second surface opposite to the first surface. The second surface has a receiving space. The motor is installed in the inner space. The blades are disposed in the inner space and driven by the motor to rotate. The PCB is disposed in the receiving space and flush with the second surface.

In an embodiment of the present invention, the motor comprises a stator structure and a rotor structure disposed correspondingly outside the stator structure.

To achieve the above objectives, the present invention provides a thin cooling fan which comprises a fan shell, a motor, a plurality of blades, and a PCB. The fan shell comprises a base plate and a shell cover. The base plate and the shell cover to each other to form an inner space. The base plate has a first surface facing toward the inner space and a second surface opposite to the first surface. The second surface has a receiving space. The motor is installed in the inner space. The blades are disposed in the inner space and driven by the motor to rotate. The PCB is disposed in the receiving space and flush with the second surface. The receiving space comprises a first receiving space disposed correspondingly to the position of the stator structure, a second receiving space disposed correspondingly outside the positions of the blades, and a third receiving space disposed between the outside of the stator structure and the inside of the blades. In an embodiment of the present invention, the receiving space comprises a first receiving space disposed correspondingly to the position of the stator structure and a second receiving space disposed correspondingly outside the positions of the blades.

In an embodiment of the present invention, the first receiving space comprises a first recess portion and a plurality of first hollow portions spaced apart. The PCB comprises a first substrate disposed corresponding to the stator structure and a plurality of first solder points spaced apart on the first substrate. The first substrate is attached to the first recess portion. The first solder points are respectively and correspondingly disposed in the first hollow portions.

In an embodiment of the present invention, the second receiving space comprises a second recess portion and a second hollow portion. The PCB comprises a second substrate disposed correspondingly outside the positions of the blades and a plurality of second solder points spaced apart on the second substrate attached to the second recess portion. The second solder points are disposed in the second hollow portion.

In an embodiment of the present invention, the receiving space further comprises a third receiving space disposed between the outside of the stator structure and the inside of the blades.

In an embodiment of the present invention, the third receiving space comprises a third hollow portion. The PCB comprises a third substrate disposed correspondingly between the outside of the stator structure and the inside of the blades. The third substrate is disposed in the third hollow portion.

Compared with the existing technology, the cooling fan of the present invention has the hollow zone disposed on the base plate; the PCB is combined with the base plate externally to cover the hollow portion correspondingly. Thus, the whole thickness of the thin cooling fan is reduced and the flow channel design in the inner space of the fan is not affected by the disposition of the PCB. Further, the PCB is combined with the fan externally, which can enhance the convenience of assembly.

DETAILED DESCRIPTION OF THE INVENTION

The detailed description and technical details of the present invention will be explained below with reference to accompanying figures. However, the accompanying figures are only for reference and explanation, but not to limit the scope of the present invention.

Figure 1:
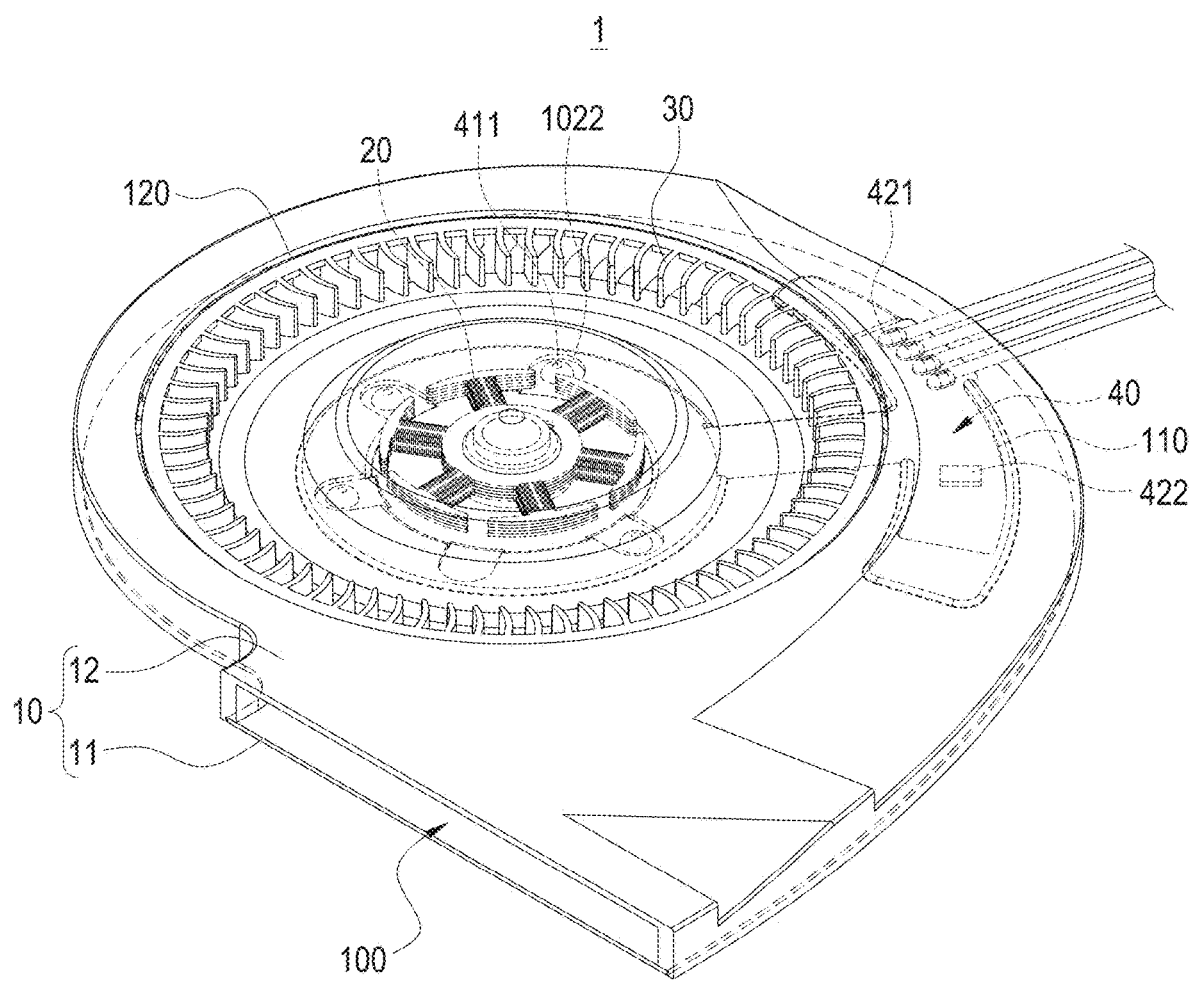
FIG. 1 is a top perspective view of the thin cooling fan of the present invention.
Figure 2:
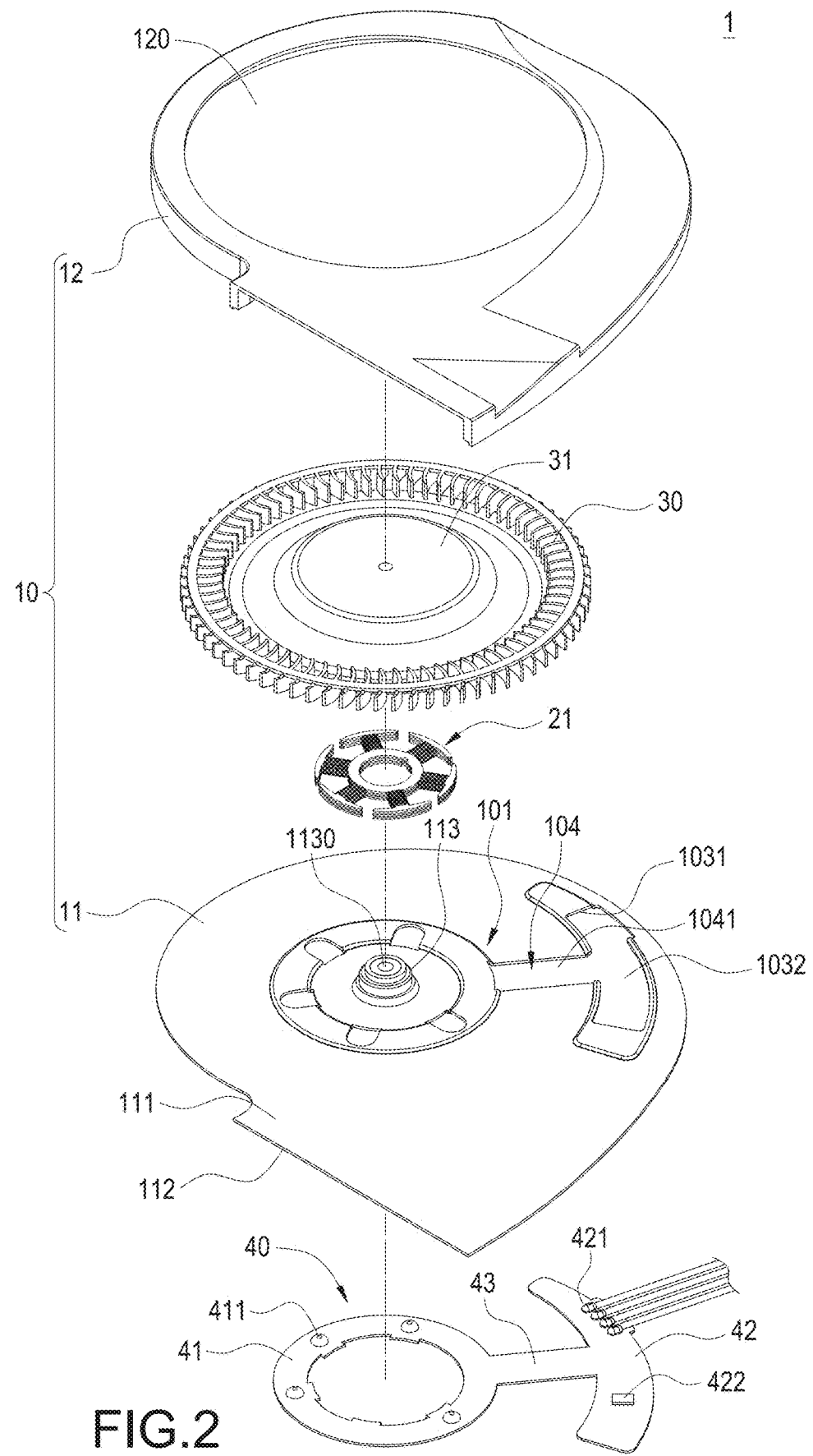
FIG. 2 is an exploded perspective view of the thin cooling fan of the present invention.
Figure 3:
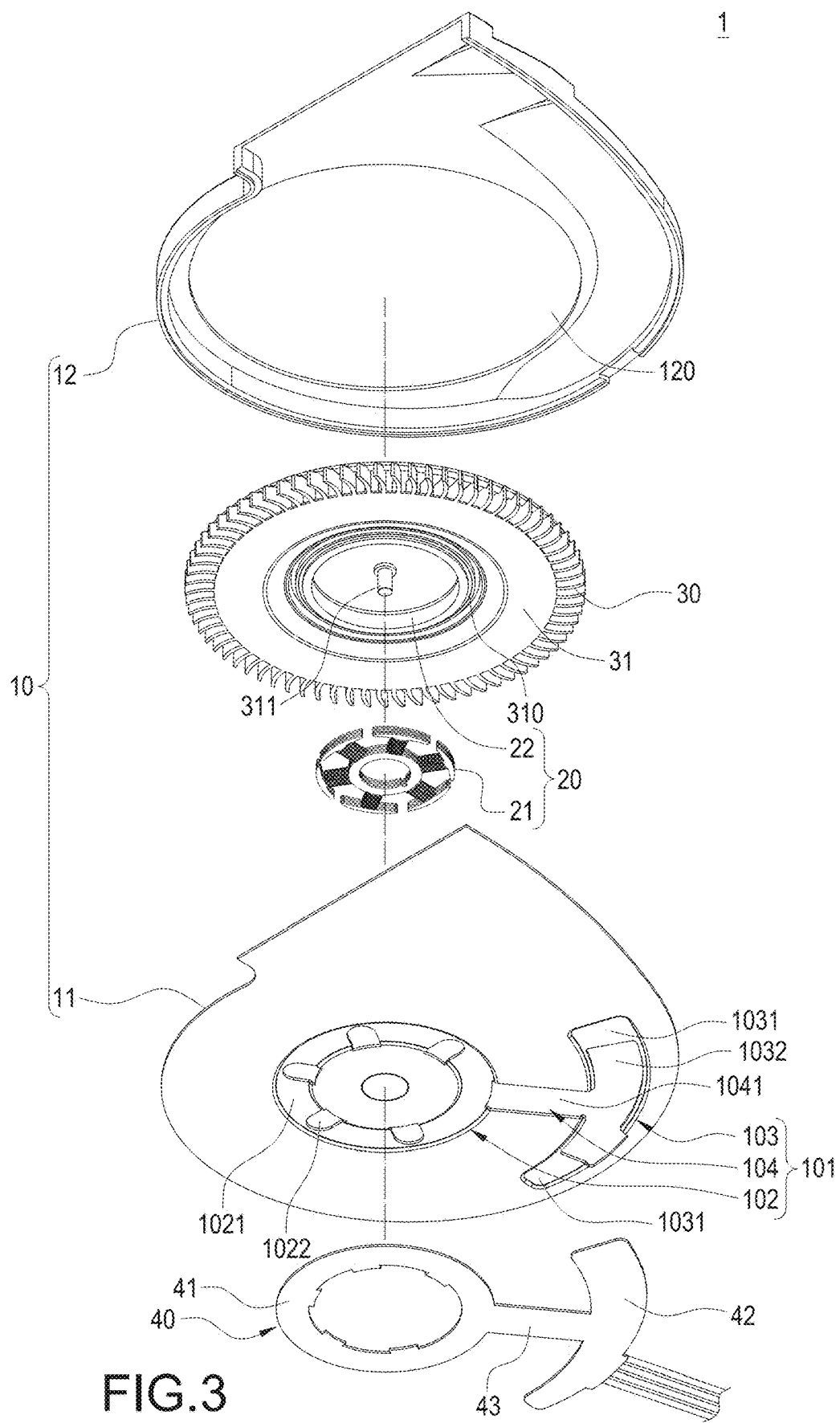
FIG. 3 is another exploded perspective view of the thin cooling fan of the present invention.

Please refer to FIGS. 1-3, which are a top perspective view and two exploded perspective views of the thin cooling fan of the present invention. The present invention provides a thin cooling fan 1 which comprises a fan shell 10, a motor 20, a plurality of blades 30, and a PCB 40. The motor 20 is combined in the inner space 100 to drive the blades 30 to rotate. The PCB 40 is used to control the operation of the motor 20.

The fan shell 10 comprises a base plate 11 and a shell cover 12. The base plate 11 and the shell cover 12 cover to each other to form an inner space 100. Also, the base plate 11 has a first surface 111 facing toward the inner space 100 and a second surface 112 opposite to the first surface 111. The second surface 112 of the base plate 11 conforms to the outline of the PCB 40 and has a receiving space 101. The receiving space 101 comprises a recess zone and a hollow zone. The recess zone comprises a first recess portion 1021 and a second recess portion 1031. The hollow zone comprises a first hollow portion 1022 and a second hollow portion 1032. The receiving space 101 comprises a first receiving space 102 and a second receiving space 103. The first recess portion 1021 and the first hollow portion 1022 together form the first receiving space 102. The second recess portion 1031 and the second hollow portion 1032 together form the second receiving space 103.

The motor 20 is installed in the inner space 100. In the current embodiment, a shaft post 113 is formed on the first surface 111 of the base plate 11. The motor 20 is disposed axially on the shaft post 113. In more detail, the motor 20 comprises a stator structure 21 sleeved around the shaft post 113 and a rotor structure 22 disposed correspondingly outside the stator structure 21.

Moreover, plural blades 30 are disposed in the inner space 100 and driven by the motor 20 to rotate, and the second receiving space 103 is disposed on the outside of the blades 30. Preferably, the blades 30 are combined around the perimeter of a hub 31, and the rotor structure 22 is combined to the hub 31. Also, in an embodiment of the present invention, the hub 31 is formed with an annular slot 310, as shown in FIG. 3. The rotor structure 22 is composed of magnets disposed inside the annular slot 310. The shaft post 113 has an axis hole 1130. A projecting shaft 311 is disposed correspondingly on the hub 31 and disposed into the axis hole 1130.

The form of the PCB 40 is unlimited. The PCB 40 may be a rigid PCB (RPC) made of FR-4, or a flexible PCB (FPC) made of polyimide film (PI film) or Poly(ethylene terephthalate) (PET film). The PCB 40 is disposed in the receiving space 101 and flush with the second surface 112. Further, the attachment between the PCB 40 and the receiving space 101 is formed by a backing adhesive (not shown). In the current embodiment, the receiving space 101 comprises a first receiving space 102 disposed corresponding to the position of the stator structure 21 and a second receiving space 103 disposed correspondingly outside the positions of the blades 30.

In more detail, the first receiving space 102 comprises a first recess portion 1021 and a plurality of first hollow portions 1022 spaced apart. The PCB 40 comprises a first substrate 41 disposed corresponding to the stator structure 21 and a plurality of first solder points 411 spaced apart on the first substrate 41. The first substrate 41 is attached to the first recess portion 1021. The first solder points 411 are disposed respectively and correspondingly in the first hollow portions 1022.

In addition, the second receiving space 103 comprises a second recess portion 1031 and a second hollow portion 1032. The PCB 40 comprises a second substrate 42 disposed correspondingly outside the positions of the blades 30, a second solder point 421 disposed on the second substrate 42, and an electronic device 422. The second substrate 42 is attached in the second recess portion 1031 and is connected to the first substrate 41, and the second solder point 421 is disposed in the second hollow portion 1032. In this way, the whole thickness of the cooling fan 1 can be reduced. In particular, the blades 30 are spaced in a radial direction and the second receiving space 103 is disposed on the outside of the ends of the blades 30 in the radial direction.

In the current embodiment, there are plural second solder points 421. The second receiving space 103 comprises two second recess portions 1031 disposed symmetrically. The second hollow portion 1032 is located between the two second recess portions 1031.

Preferably, when the PCB 40 is fixed to the base plate 11, the distance from the electronic device 422 and the second solder points 421 to the edge of the base plate 11 is greater than 0.3 mm, but not limited to this when implementation of the present invention. Note that when the second solder points 421 are disposed at the edge of the base plate 11, the base plate 11 has to be provided correspondingly with a hollow zone that is then covered by the PCB 40, preventing the PCB 40 from occupying the flow space inside the fan.

Moreover, the receiving space 101 further comprises a third receiving space 104 disposed between the outside of the stator structure 21 and the inside of the blades 30. The third receiving space 104 comprises a third hollow portion 1041. The PCB 40 comprises a third substrate 43 disposed correspondingly between the outside of the stator structure 21 and the inside of the blades 30. The third substrate 43 is disposed in the third hollow portion 1041.

Figure 4:
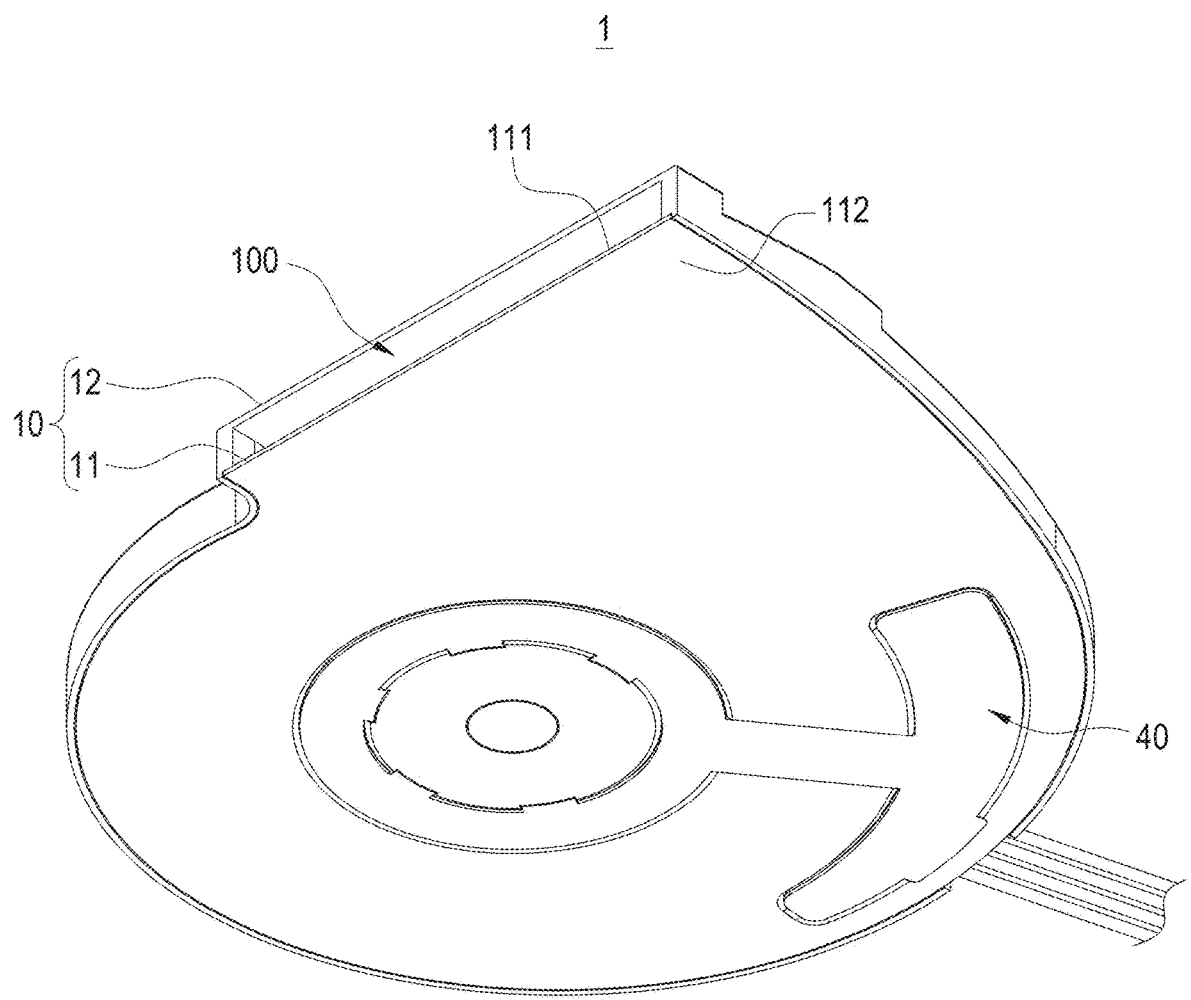
FIG. 4 is a bottom perspective view of the thin cooling fan of the present invention.
Figure 5:
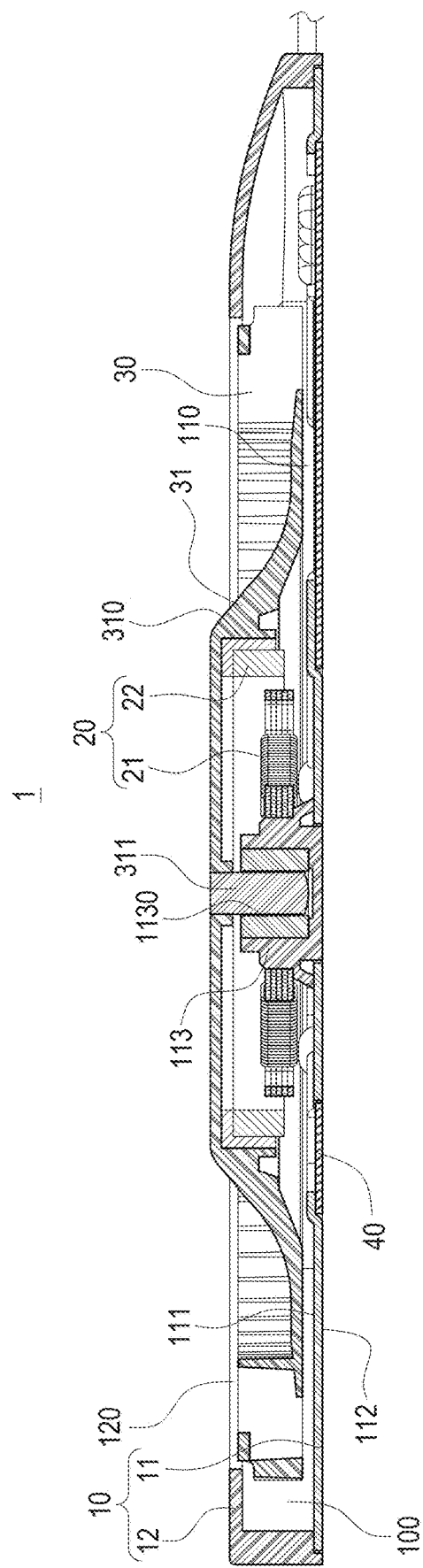
FIG. 5 is an assembled cross-sectional view of the thin cooling fan of the present invention.

Please refer to FIGS. 4 and 5, which are a bottom perspective view and an assembled cross-sectional view of the thin cooling fan of the present invention, respectively. The PCB 40 of the cooling fan 1 of the present invention is combined with the base plate 11 externally to be disposed in the receiving space 101 and is attached to the base plate 11 using the backing adhesive. Note carefully that a side surface of the PCB 40 is flush with the second surface 112.

With an electrical connection between the PCB 40 and the stator structure 21, when the cooling fan 1 rotates, the electromagnetic effect induced between the stator structure 21 and the rotor structure 22 will drive and rotate the rotor structure 22. Consequently, the blades 30 coupled to the rotor structure 22 will rotate to generate the air flow through which the heat is dissipated.

Note that, in the current embodiment, the shell cover 12 is provided with an opening 120. The blades 30 and the hub 31 are protruded and exposed in the opening 120. Thus, the whole height of the cooling fan 1 is further reduced.

Figure 6:
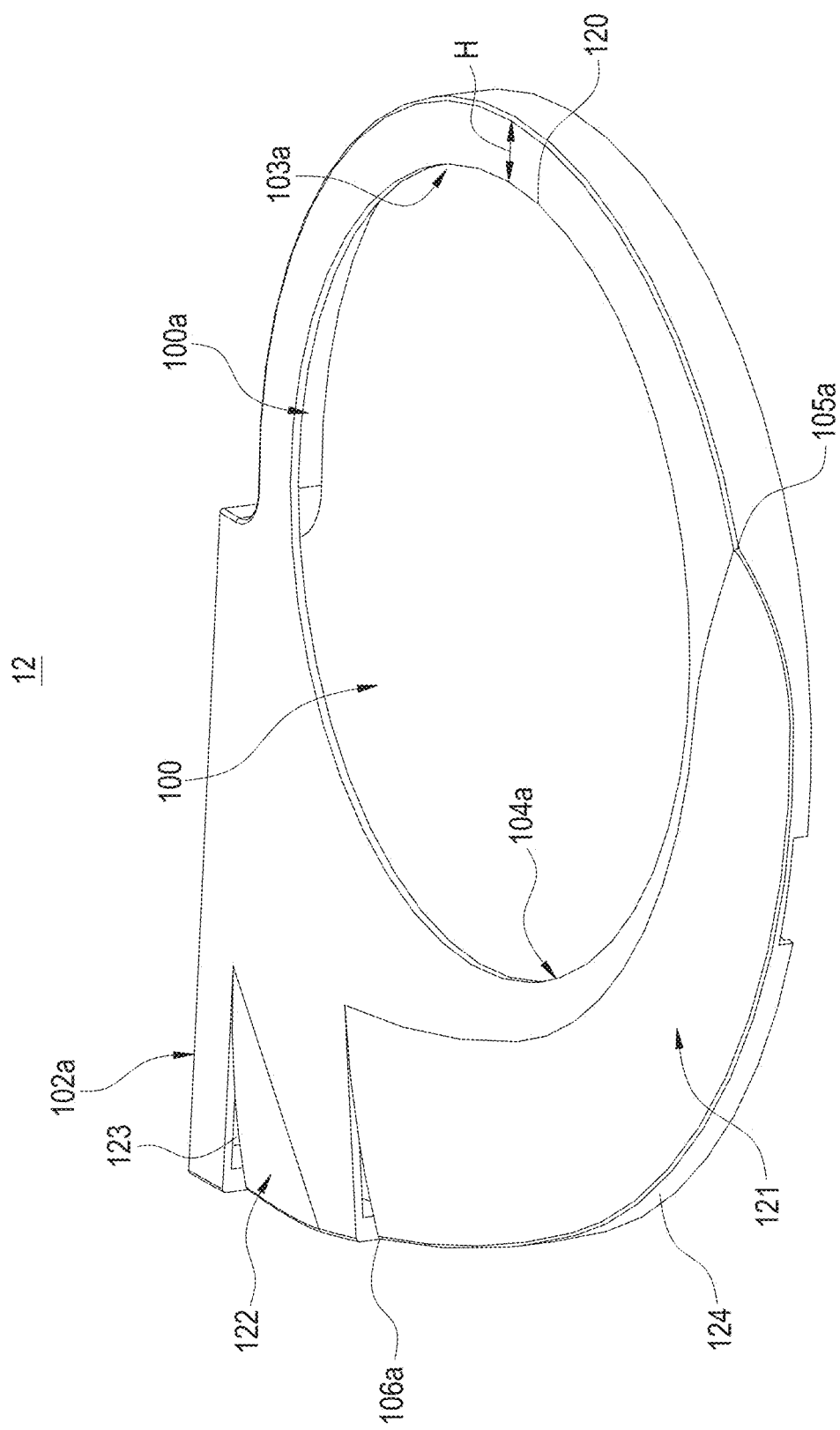
FIG. 6 is a top perspective view of the shell cover of the thin cooling fan of the present invention.

Again, please refer to FIG. 6 which is a top perspective view of the shell cover of the thin cooling fan of the present invention. In the present invention, the base plate 11 and the shell cover 12 cover to each other to form an inner space 100 and an air channel 100a. The shell cover 12 of the present invention is provided with an opening 120, and the air channel 100a is located at a periphery of the inner space 100. Besides, the shell cover 12 extends along the air channel 100a to form a curved surface 121 which is recessed toward the inner space 100.

One thing needs explanation is that the disposition of the curved surface 121 is used to increase the air pressure of the thin cooling fan 1 to obtain a smooth flow field to guide and concentrate the air flow in the strong wind zone, which facilitates a uniform outlet flow. Further, the disposition of the curved surface 121 can reduce the internal flow resistance of the thin cooling fan 1, which increases the suction force to enhance heat dissipation.

In particular, the air channel 100a has an outlet 102a, a first pressurization zone 103a, and a second pressurization zone 104a communicating with the first pressurization zone 103a. The first and the second pressurization zones 103a, 104a are disposed at both sides of the outlet 102a. Preferably, the curved surface 121 is disposed in the second pressurization zone 104a. In addition, the air channel 100a has a channel width H, and the channel width of the first pressurization zone 103a is less than that of the second pressurization zone 104a.

It is worth noting that, in an embodiment of the present invention, the shell cover 12 further comprises at least one guiding slot 122 and at least one auxiliary inlet 123 disposed in the at least one guiding slot 122. The dispositions of the guiding slot 122 and the auxiliary inlet 123 can induce an auxiliary air flow effectively to avoid vortices and increase the air flow, which enhances the air flow uniformity at the outlet 102a. As a result, a good heat dissipation effect can be achieved in an electronic device with a limited space.

Moreover, the guiding slot 122 slopes from the surface of the shell cover 12 toward the auxiliary inlet 123 which communicates with the air channel 100a. Preferably, the at least one guiding slot 122 and the at least one auxiliary inlet 123 are adjacent to the outlet 102a. Also, the at least one guiding slot 122 and the at least one auxiliary inlet 123 are adjacent to the curved surface 121.

In an embodiment of the present invention, the at least one guiding slot 122 and the at least one auxiliary inlet 123 are plural in number, and the guiding slots 122 and the auxiliary inlets 123 are disposed correspondingly along the air channel 100a in a front-to-rear arrangement.

Figure 7:
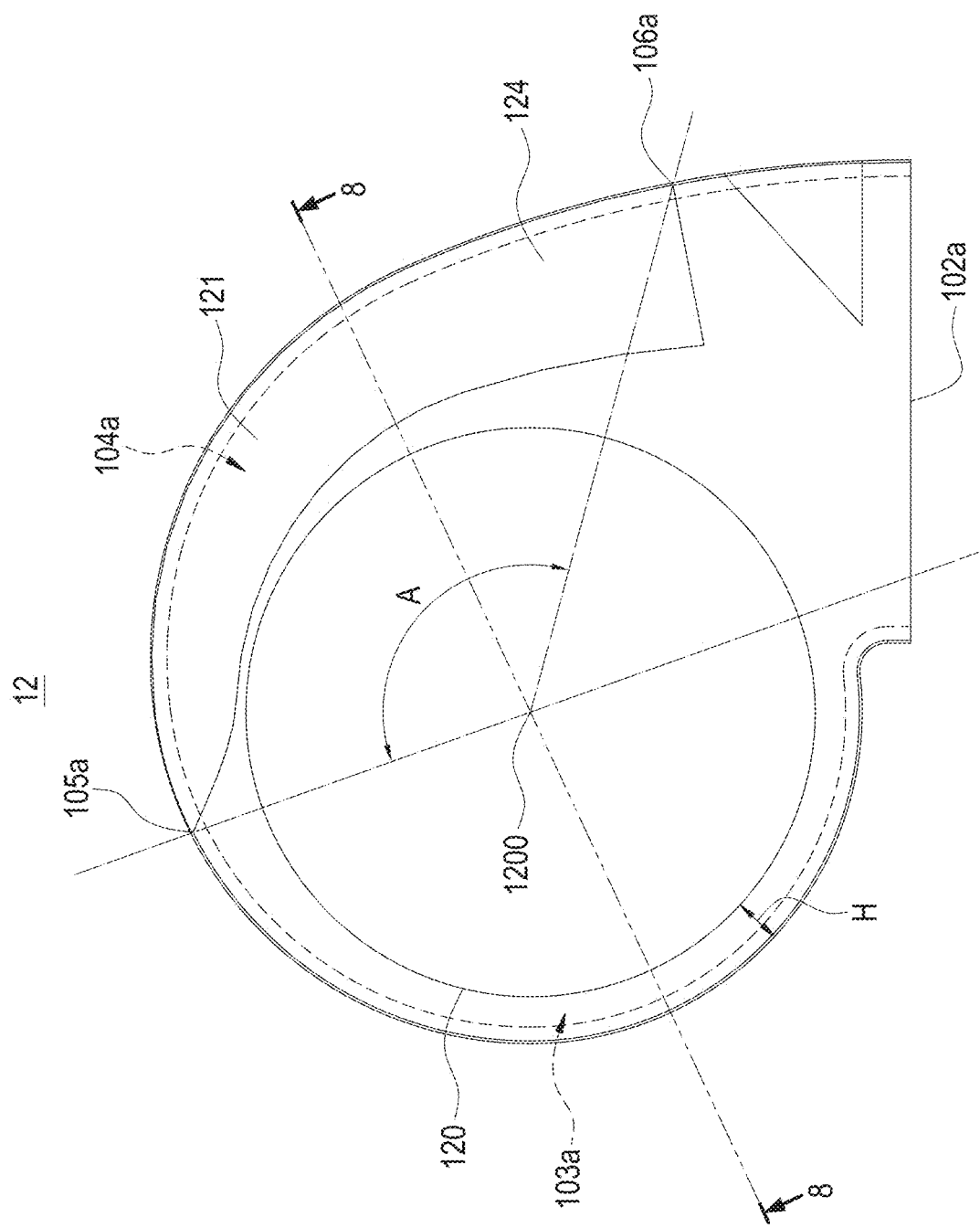
FIG. 7 is a top view of the shell cover of the thin cooling fan of the present invention.
Figure 8:
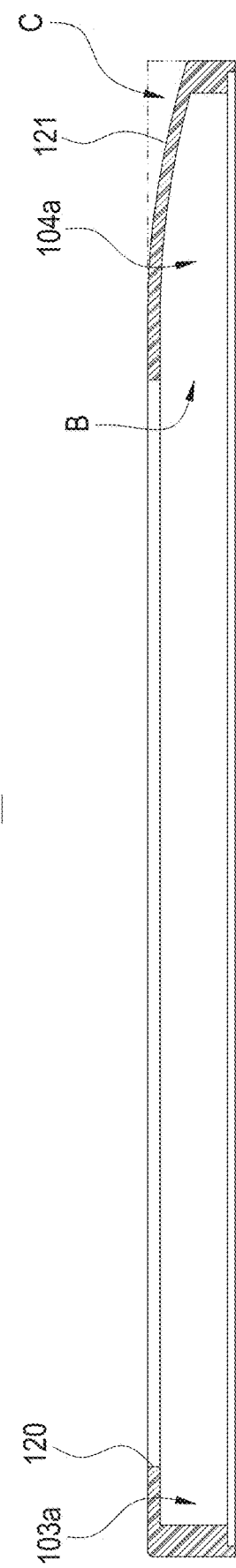
FIG. 8 is a cross-section view along the line 8-8 of FIG. 7.

Please refer to FIGS. 7 and 8, which are the top view of the shell cover of the thin cooling fan of the present invention and the cross-section view along the line 8-8 of FIG. 7, respectively. As shown in FIG. 7, in an embodiment of the present invention, an opening center 1200 is disposed in the opening 120 of the shell cover 12 which has a frame edge 124. Besides, the second pressurization zone 104a has a pressurization start 105a and a pressurization end 106a disposed on the frame edge 124. An angle A is defined by the vertex of the opening center 1200, a line segment from the opening center 1200 to the pressurization start 105a and a line segment from the opening center 1200 to the pressurization end 106a. The angle A is between 0 and 140 degrees. Preferably, the angle A is 125 degrees. It is worth noting that the line defined by the pressurization start 105a and the opening center 1200 passes through the outlet 102a.

As shown in FIG. 8, the air channel 100a is disposed at the outer edge of the inner space 100. Further, a flow cross section B having a flow cross section area is defined by cutting the air channel 100a along a profile line A-A passing through the opening center 1200. More, the curved surface 121 has a curved cross section C having a curved cross section area along the profile line A-A. The ratio of the curved cross section area to the flow cross section area ranges from 1% to 5%, which is not limited to this and is adjustable in practical application depending on the operating conditions. Preferably, the ratio of the curved cross section area to the flow cross section area is 3%.

The embodiments described above are only preferred ones of the present invention and not to limit the scope of appending claims regarding the present invention. Therefore, all the equivalent modifications applying the spirit of the present invention should be embraced by the scope of the appending claims of the present invention.

What is claimed is:
1. A cooling fan, comprising:
a fan shell comprising a base plate and a shell cover, wherein the base plate and the shell cover are combined with each other to form an inner space and an air channel, wherein the base plate has a first surface facing the inner space and a second surface opposite to the first surface, wherein the second surface has a receiving space comprising a recess zone and a hollow zone, wherein the shell cover extends along the air channel to form a curved surface gradually sloped downward toward an outer edge to configure a pressurization start and a pressurization end;
a motor installed in the inner space;
a plurality of blades disposed in the inner space and driven by the motor; and
a printed circuit board (PCB) disposed in the receiving space and flush with the second surface,
wherein
the shell cover comprises at least one guiding slot and at least one auxiliary inlet disposed in the at least one guiding slot, and the at least one guiding slot slopes from a surface of the shell cover toward the at least one auxiliary inlet which communicates with the air channel, the shell cover comprises a tip at the pressurization start, and a width of the curved surface gradually increases from the pressurization start to the pressurization end.

2. The cooling fan according to claim 1,
wherein the air channel has an outlet, a first pressurization zone, and a second pressurization zone communicating with the first pressurization zone, the first and the second pressurization zones are located at opposite sides of the inner space,
wherein the air channel has a channel width, and a channel width of the first pressurization zone is less than a channel width of the second pressurization zone,
wherein the shell cover is provided with an opening and has a frame edge, and
wherein the second pressurization zone has the pressurization start and the pressurization end disposed on the frame edge, and a line defined by the pressurization start and a center of the opening of the shell cover passes through the outlet.

3. The cooling fan according to claim 2, wherein the curved surface is disposed in the second pressurization zone.

4. The cooling fan according to claim 2, wherein the blades are protruded and exposed, wherein the air channel is disposed at an outer edge of the opening.

5. The cooling fan according to claim 4,
wherein an angle is defined by a vertex of the center of the opening, a line segment from the center of the opening to the pressurization start, and a line segment from the center of the opening to the pressurization end, and
wherein the angle is between 0 and 140 degrees.

6. The cooling fan according to claim 5, wherein the angle is 125 degrees.

7. The cooling fan according to claim 5,
wherein the air channel is located at a periphery of the inner space,
wherein a flow cross section having a flow cross section area is defined by cutting the air channel along a profile line passing through the center of the opening,
wherein the curved surface has a curved cross section having a curved cross section area along the profile line, and
wherein a ratio of the curved cross section area to the flow cross section area ranges from 1% to 5%.

8. The cooling fan according to claim 7, wherein the ratio of the curved cross section area to the flow cross section area is 3%.

9. The cooling fan according to claim 2, wherein the at least one guiding slot and the at least one auxiliary inlet are adjacent to the outlet.

10. The cooling fan according to claim 1, wherein the at least one guiding slot and the at least one auxiliary inlet are adjacent to the curved surface.

11. The cooling fan according to claim 1, wherein the at least one guiding slot and the at least one auxiliary inlet are plural in number, and wherein the guiding slots and the auxiliary inlets are disposed correspondingly along the air channel.

12. The cooling fan according to claim 1, wherein the shell cover extends along the air channel to define a gradual offset at the pressurization end between the curved surface and an adjacent surface of the shell cover.

\* \* \* \* \*